United States Patent [19]
Motoura et al.

[11] Patent Number: 5,990,022
[45] Date of Patent: Nov. 23, 1999

[54] METHOD OF EVALUATING A SILICON WAFER

[75] Inventors: Hisami Motoura; Eiichi Asano, both of Kanagawa, Japan

[73] Assignee: Komatsu Electronic Metals Co., Ltd., Kanagawa, Japan

[21] Appl. No.: 08/998,756

[22] Filed: Dec. 29, 1997

[30] Foreign Application Priority Data

Dec. 27, 1996 [JP] Japan .................................. 8-357514

[51] Int. Cl.$^6$ .................................................. H01L 21/312
[52] U.S. Cl. .................... 438/745; 438/745; 438/751; 438/753; 438/750; 438/754; 156/612; 156/643
[58] Field of Search ...................................... 438/745, 751, 438/753, 750, 754; 156/612, 643

[56] References Cited

U.S. PATENT DOCUMENTS

| | | | |
|---|---|---|---|
| 4,053,335 | 10/1977 | Hu | 148/174 |
| 5,310,703 | 5/1994 | Visser et al. | 437/229 |
| 5,734,195 | 3/1998 | Takizawa et al. | 257/607 |

FOREIGN PATENT DOCUMENTS

| | | | |
|---|---|---|---|
| 870009 | 3/1996 | Japan | H01L 21/324 |
| 8124984 | 5/1996 | Japan | H01L 21/66 |

*Primary Examiner*—Felisa C. Hiteshew
*Assistant Examiner*—Lan Vinh
*Attorney, Agent, or Firm*—Sughrue, Mion, Zinn, Macpeak & Seas, PLLC

[57] ABSTRACT

The evaluating method includes: dipping a mirror-polished silicon wafer in a dilute hydrofluoric acid; washing the surface of the silicon wafer; subjecting the surface-washed silicon wafer to a heat treatment in an oxygen atmosphere to form a thermal oxidation film; forming a predetermined number of polycrystalline silicon electrodes having a predetermined area on the thermal oxidation film; applying a voltage to each electrode between the predetermined number of polycrystalline silicon electrodes and the silicon wafer; and judging the quality of the mirror-polishing process of the silicon wafers in accordance with the breakdown electric field intensity of the leakage current obtained by measuring the oxide film insulation.

7 Claims, 4 Drawing Sheets

METHOD OF EVALUATING A SILICON WAFER

BACKGROUND OF THE INVENTION

1. Field of the Invention

The present invention relates to a method of evaluating a silicon wafer, in particular to an evaluating method suitable for judging the quality of the mirror-polishing process of a silicon wafer.

2. Description of the Related Art

Semiconductor devices usually use a silicon wafer having at least one mirror-polished surface, which is obtained by slicing a silicon single crystal manufactured by the CZ method or the FZ method, chamfering the periphery thereof, and then grinding, lapping and polishing the surface or the reverse surface thereof.

However, the grinding and polishing applied to the silicon wafer for the purpose of mirror-polishing cause damage to the wafer surface. The damage is a local residual strain that can not be distinguished visually. According to the manufacturing method of semiconductor silicon wafers disclosed in JP-A 8-70009 (JP-A: Unexamined Japanese patent publication), whether a damage is caused can be ascertained by applying selective etching to the silicon wafer and then observing with a microscope. Moreover, the damage can be eliminated by applying a short-period low-temperature heat treatment to the silicon wafer.

The above-mentioned method of manufacturing a silicon wafer is a method of eliminating the damage on the surface of the silicon wafer caused by the mirror-polishing process. Whether the quality is good can be ascertained by the selective etching. However, even applying selective etching to the silicon wafer, it is difficult to evaluate the degree of the damage, i.e, the quality of the mirror-polishing process. In particular, the relationship of the degree of damage with the quality of the electrical characteristics such as oxide film insulation, which is an important quality characteristic to the semiconductor devices, can not be ascertained.

According to the manufacturing method of semiconductor silicon wafers disclosed in JP-A-8-124984, a method of detecting a fraction defect of breakdown voltage, discloses the steps of: dipping a mirror-polished silicon wafer in a dilute hydrofluoric acid;

washing the surface of the silicon wafer;

subjecting the surface-washed silicon wafer to a heat treatment in an oxygen atmosphere to form a thermal oxidation film;

forming a predetermined number of polycrystalline silicon electrodes having a predetermined area on the thermal oxidation film;

applying a voltage to each electrode between the predetermined number of polycrystalline silicon electrodes and the silicon wafer; and measuring the breakdown voltage.

According to the method, octahedral oxygen precipitation defect is selectively solved in many kind of defects which are near the surface of the silicon wafer, thereby the breakdown voltage is made lower, and therefore an average density of the octahedral oxygen precipitation can be presumed more accurately.

According to the method, an average density of the octahedral oxygen precipitation is calculated and presumed based on a value obtained by detecting a fraction defect of breakdown voltage. However according to the method only average density of the octahedral oxygen precipitation is obtained but it is impossible to distinguish a deterioration caused by the crystal defect from a defect of breakdown voltage of oxidation film caused by mirror polishing process.

Whether damage is caused or notice can be ascertained by applying selective etching to the silicon wafer and then observing with a microscope. Moreover, the damage can be eliminated by applying a short-period low-temperature heat treatment to the silicon wafer.

SUMMARY OF THE INVENTION

In view of the above problem of the prior art, an object of the invention is to provide a method of evaluating a silicon wafer, capable of simply ascertaining the degree of the oxide film insulation deterioration based on the damage due to process defects of the silicon wafer caused by the mirror-polishing process simply, or the washing process after the mirror-polishing process, and improving the mirror-polishing process based on the results of the evaluation. A process defect is considered a scratch induced in the mirror-polishing or composite defect of mechanical damage and impurity.

In order to attain the above object, a first aspect of the method of evaluating a silicon wafer according to the invention includes:

treating a mirror-polished silicon wafer in a dilute hydrofluoric acid;

subjecting the surface-treated silicon wafer to a heat treatment in an oxygen atmosphere to form a thermal oxidation film;

forming a predetermined number of electrodes having a predetermined area on the thermal oxidation film;

measuring a leakage current caused by applying a voltage between each of the electrodes and the silicon wafer while increasing a voltage step by step; and judging the quality of the mirror-polishing process of the silicon wafers based on whether the leakage current at the point of inflection of the I-V characteristic exceeds the predetermined reference value or not, wherein the I-V characteristic is obtained by the relationship between the electric field intensity and the leak current caused by the electric field.

A second aspect of the method of evaluating a silicon wafer is a method according to the first aspect, wherein the step of treating comprises the steps of:

dipping a mirror-polished silicon wafer in a dilute hydrofluoric acid; and cleaning the silicon wafer.

A third aspect of the method of evaluating a silicon wafer is a method according to the second aspect, wherein the step of cleaning comprises a step of SC-1 cleaning.

A fourth aspect of the method of evaluating a silicon wafer is a method according to the first aspect, wherein the reference value is 6 MV/cm in the step of judging.

A fifth aspect of the method of evaluating a silicon wafer is a method according to the first aspect, wherein the step of dipping comprises dipping in a diluted hydrogen fluoride solution which has a concentration more than 1.5 weight %.

A sixth aspect of the method of evaluating a silicon wafer is a method according to the first aspect, wherein the step of judging comprises the steps of:

treating a standard wafer without mirror-polishing in a dilute hydrofluoric acid, and measuring a standard leakage current caused by applying a voltage between each of the electrodes and the silicon wafer while increasing the voltage step by step, and calculating a I-V characteristic; and judging the quality of the mirror-polishing process of the silicon wafers based on the shift between the I-V characteristic of the mirror-polished wafer and that of the standard wafer.

A seventh aspect of the method of evaluating a silicon wafer is a method according to the first aspect, wherein the electrodes comprise polycrystalline electrodes.

According to the above, after dipping in hydrofluoric acid and washing with SC-1 solution, a MOS capacitor is formed and the oxide film insulation is measured, so that the quality of the polishing process to the silicon wafer can be judged from the profile obtained from the above measurement. The degree of the damage caused by the mirror-polishing can not be recognized in terms of the difference of the electrical characteristics without performing the above dipping process in hydrofluoric acid.

Inventors of the present invention conducted many experiments and found that the profile of the process-defect I-V characteristic (obtained by measuring a breakdown voltage of oxide film) has a point of inflection corresponding to a point where a leakage current starts to rise. The defect formed in the mirror-polishing process causes the leakage current (shown in the process-defect I-V characteristic) to rise gradually starting from a lower voltage (electric field intensity). Consequently, the point of inflection of the process-defect I-V characteristic is lower than the point of inflection of an I-V characteristic of a wafer having a crystal (grown-in) defect.

It is preferable to measure the I-V characteristic of standard wafer first. Thereafter, whether the quality of the mirror-polishing process of a silicon wafer is good or not is judged by comparing the I-V characteristic of the mirror-polished with the I-V characteristic of the standard wafer.

BRIEF DESCRIPTION OF THE DRAWINGS

The examples of the method of evaluating a silicon wafer of the invention are described with reference to the accompanying drawings, in which.

DESCRIPTION OF THE PREFERRED EMBODIMENTS

Figure 1:
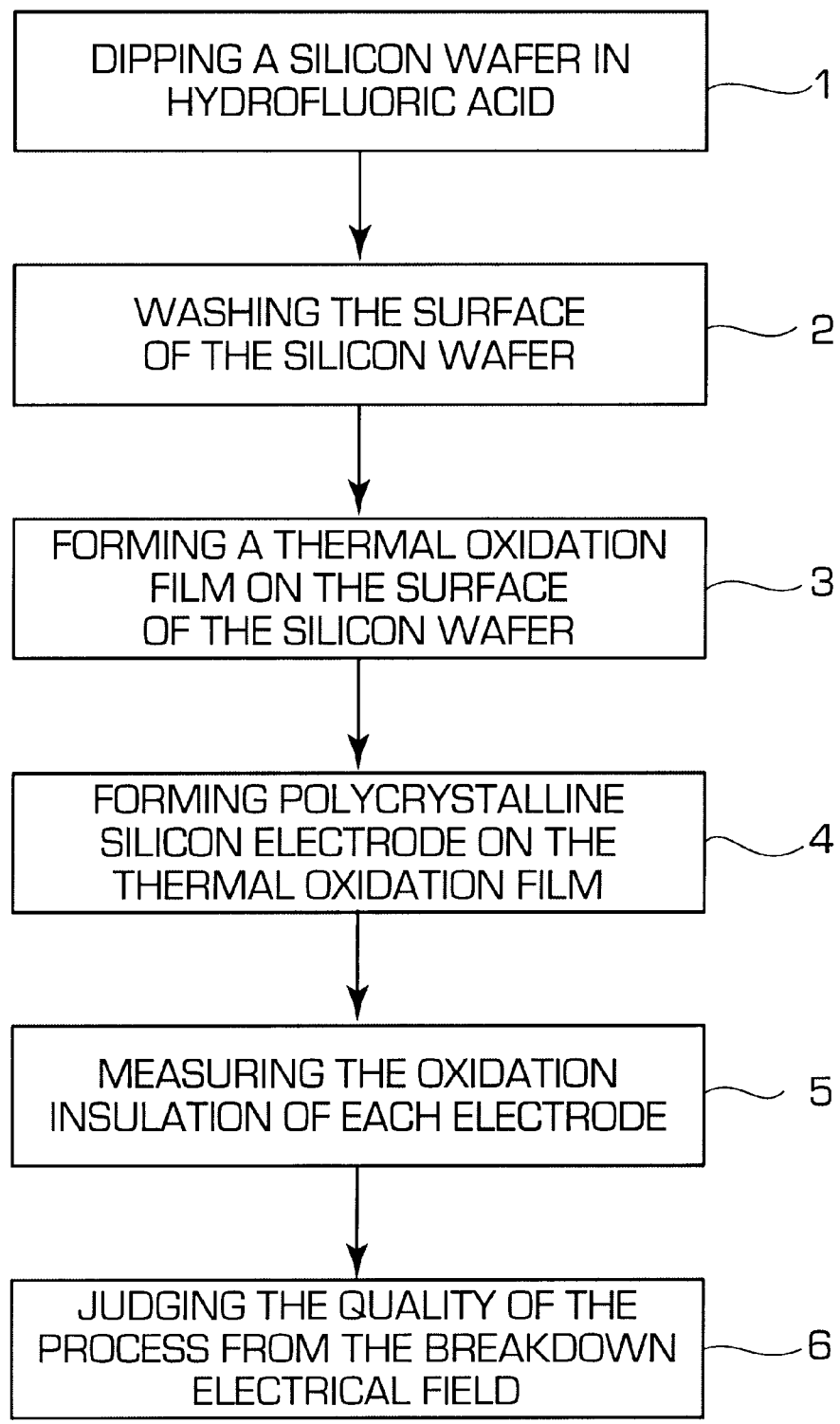
FIG. 1 is a flow chart showing the sequences of the method of evaluating a silicon wafer according to the invention.

FIG. 1 is a flow chart showing the sequences of the method of evaluating a silicon wafer according to the invention. The numerals set forth in the left of each step represent the number of the step.

In the first step, a silicon wafer, which has been mirror-polished, is dipped in a dilute hydrofluoric acid to remove the impurities on the surface of the wafer. The concentration of the dilute hydrofluoric acid is greater than 1.5 wt %, and the dipping time exceeds 1 minute. For example, when the concentration of the dilute hydrofluoric acid is 10 wt %, the silicon wafer is dipped for 5 minutes. In the second step, the surface of the silicon wafer is washed. The washing includes washing with pure water, and washing with a Standard Cleaning 1, or SC-1, solution composed of $H_2O + H_2O_2 + NH_4OH$, commonly used in the industry, followed by washing with pure water.

Then the third step is performed. The silicon wafer is subjected to a heat treatment in an oxidizing atmosphere to form a thermal oxide film on the surface thereof. Further in the fourth step, a polycrystalline silicon layer is formed on the thermal oxide film, and a predetermined number of polycrystalline silicon electrodes having a predetermined area are formed by photolithography. In this way, MOS capacitors are formed by the thermal oxide film as an insulation layer therein, between the silicon wafer and the polycrystalline silicon electrodes.

In the fifth step, each electrode formed on the silicon wafer is brought into contact with a probe, and a voltage is applied between the wafer and electrode. The applied voltage is then raised and the electrical current at that time is measured. The voltage-current characteristics obtained by this measurement are called the I-V characteristics. Regarding the I-V characteristics, the electric field that causes a certain current, for example, a current of 10 $\mu A$ (criterion current), is applied and is regarded as the insulation breakdown electric field of the oxide film, and thus nondefective articles and defective articles are classified based on the criterion determined in step 6.

Figure 2:
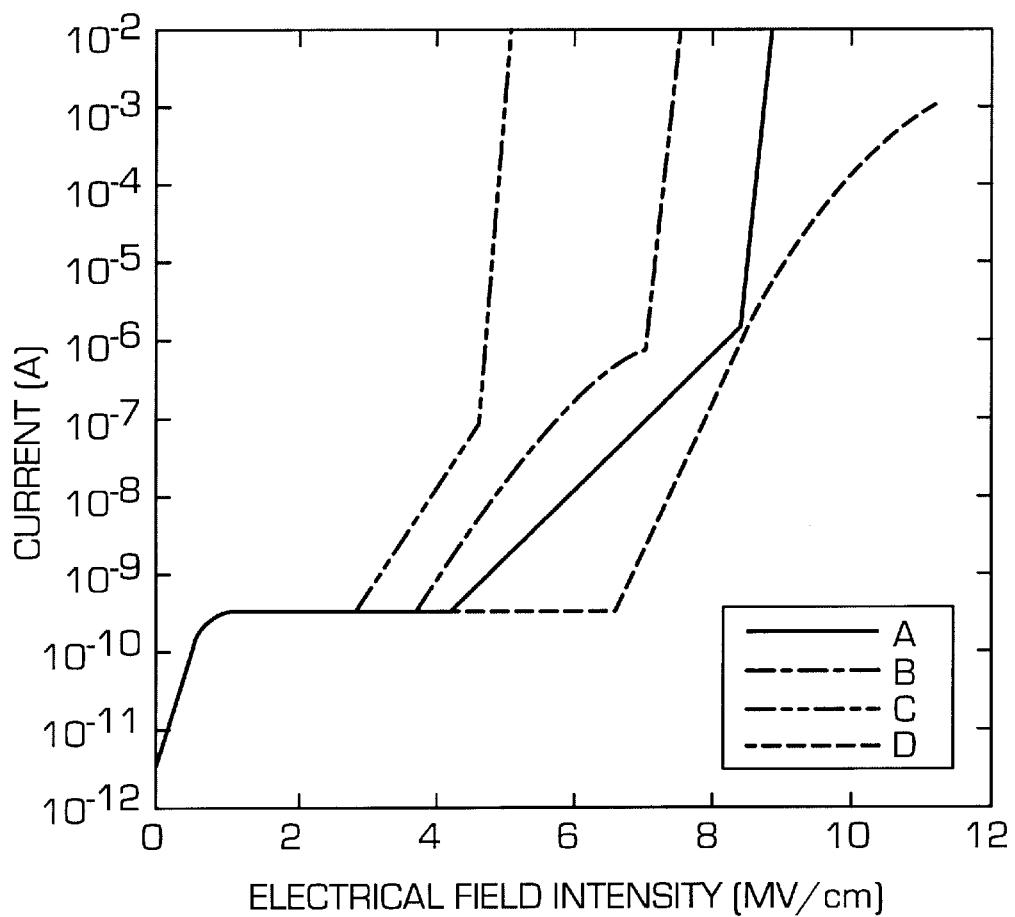
FIG. 2 is a graph showing the results of measurement of the oxide film insulation of silicon wafers.

FIG. 2 is a graph schematically showing the results of measurement of the oxide film insulation of the silicon wafers, which constitute the MOS capacitors. In this Figure, A, B and C represent respectively the polishing processing conditions. Moreover, D is the result of measurement of the oxide film insulation when a thermal oxide film and a polycrystalline silicon electrode are formed thereon in order, without dipping the silicon wafer in a dilute hydrofluoric acid. As is shown in the same figure, at the point where the leakage current starts to rise, the electric field intensity is about 4.2 MV/cm for A condition, is about 3.7 MV/cm for B condition, and is about 2.8 MV/cm for C condition. Among the processing conditions, A condition is the best and the C condition is the worst. Accordingly, the I-V characteristics change in accordance with the degree of the damage (residual strains, etc.) caused by the mirror-polishing process. When the processing imperfection becomes larger, the I-V characteristics shift to a low electric field.

In contrast, the point where the leakage current starts to rise is about 6.6 MV/cm for wafer D. That is, wafers which have not been washed with a dilute hydrofluoric acid or have no damage have D profile, and thus the quality of the mirror-polishing process can not be judged. However, when performing the dipping process in a diluted HF of the invention, all wafers having defects caused by a mirror-polishing process have an e.g. A, B or C profile, and the quality of the mirror polishing can be easily judged.

When the oxide film insulation is degraded by the mirror-polishing process, the profile of the I-V characteristics per se changes, and thus can be easily judged. Although the I-V profile can be used to judge the influence to the oxide film insulation caused by the mirror-polishing process, the judgment must be based on the electric field at 1 nA in a low electric field, and at 10 mA in a high electric field.

Figure 3:
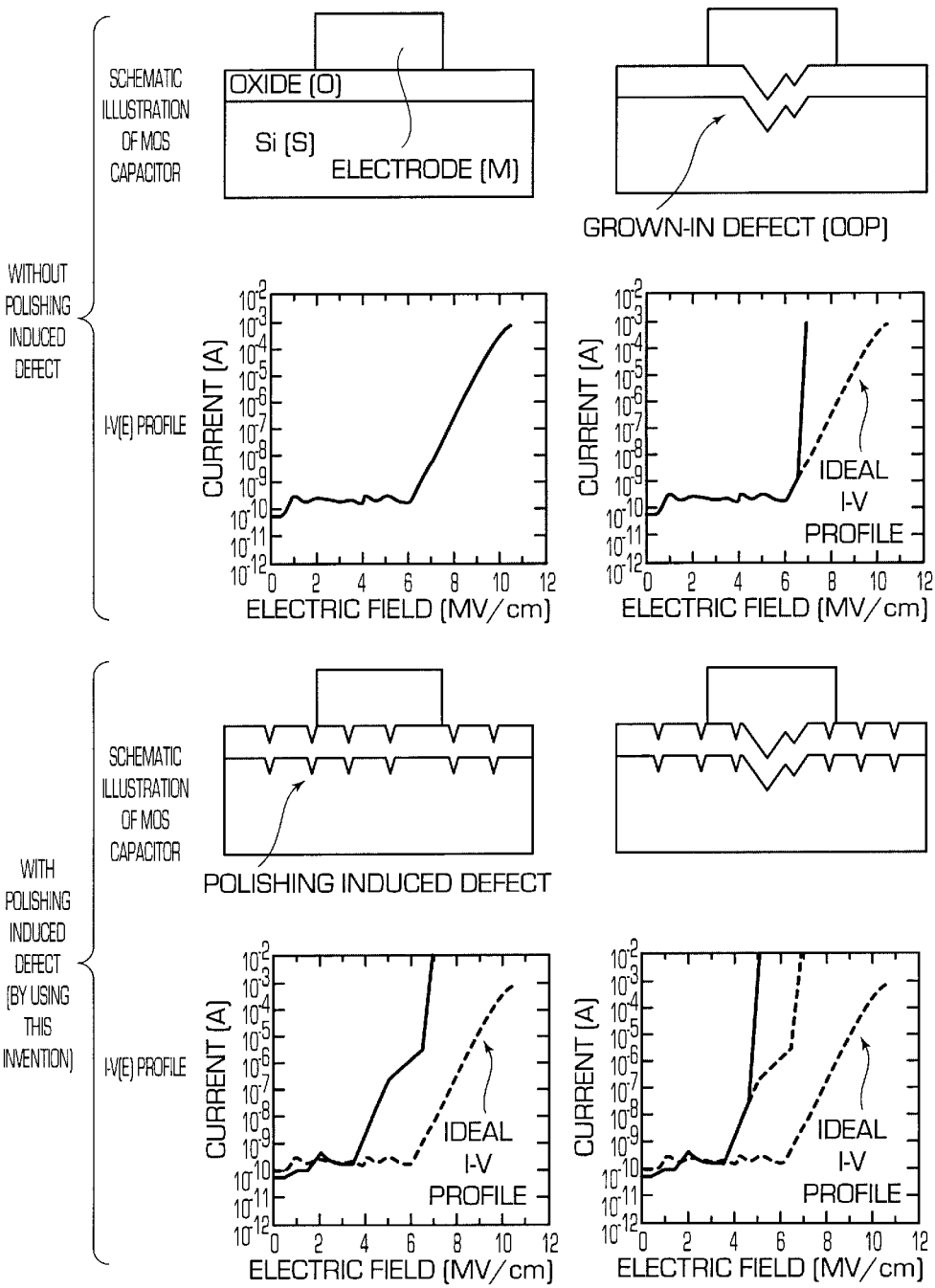
FIG. 3 represents a comparative explanation of the principle of the present invention and conventional method.

FIG. 3 represents a comparative explanation of the principle of the present invention and conventional method. In FIG. 3, a difference relationship of a surface state of a wafer caused by process defect of the present invention and crystal defect (grown-in defect) is shown.

As shown in FIG. 3, in the case where the wafer has a grown-in defect, the I-V characteristic is deteriorated rapidly. On the other hand, in the case where a wafer having a process defect is treated by the step of dipping in the diluted HF, the profile of the process-defect I-V characteristic (obtained by measuring a breakdown voltage of oxide film) has a point of inflection corresponding to a point where a leakage current starts to rise. The defect formed in the mirror-polishing process causes the leakage current (shown in the process-defect I-V characteristic) to rise gradually starting from a lower voltage (electric field intensity). Consequently, the point of inflection of the process-defect I-V characteristic is lower than the point of inflection of an I-V characteristic of a wafer having a crystal (grown-in) defect. The leakage current corresponds to a FN tunneling current.

Figure 4:
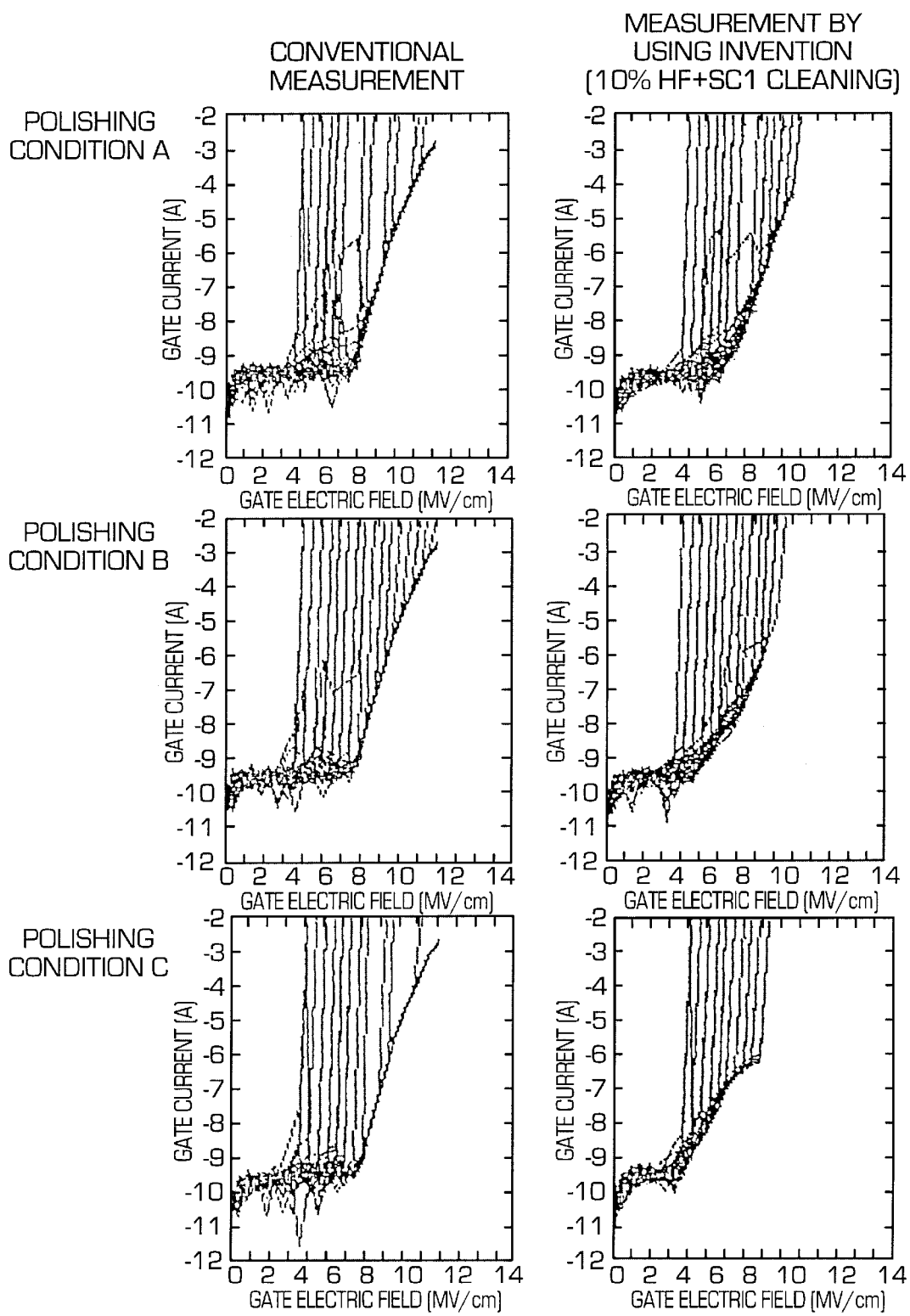
FIG. 4 is a graph showing the results of measurement of the oxide film insulation of silicon wafers.

FIG. 4 is a graph showing the results of measurement of the oxide film insulation of silicon wafers. By performing the process of the present invention with respect to the wafers mirror-polished by the conditions A,B,C, differences among the conditions are detected clearly. The I-V characteristic curves in the FIG. 4 are obtained by overlapping all values measured at 100 points in a wafer surface. As stated above, process characteristics can be evaluated easily by evaluating a electric field of soft leakage field.

As a material for electrode, another material such as metal can be used without being limited by polysilicon.

As stated above, according to the invention, by dipping a mirror-polished silicon wafer with a dilute hydrofluoric acid, washing the wafer and forming a MOS capacitor in a surface of the wafer, the difference of the level of the mirror-polishing process can be recognized as the degradation of the oxide film insulation characteristics. Accordingly, it is possible to ascertain the degree of damage on a silicon wafer caused by the mirror-polishing process. Such information can be fed back and the mirror-polishing process can be improved.

What is claimed is:

1. A method of evaluating a silicon wafer comprising the steps of:

treating a mirror-polished silicon wafer in a dilute hydrofluoric acid;

subsequent to said treating step, subjecting said mirror-polished silicon wafer to a heat treatment in an oxygen atmosphere to form a thermal oxidation film;

forming a plurality of electrodes each having a surface area in contact with said thermal oxidation film;

measuring a leakage current caused by applying a testing voltage between each of said plurality of electrodes and said mirror-polished silicon wafer while increasing said testing voltage step by step; and judging a quality of a mirror-polishing process that was used to process said mirror-polished silicon wafer; wherein said judging is based on whether a leakage current at a point of inflection of a mirror-polished test I-V characteristic exceeds a reference value, wherein said mirror-polished test I-V characteristic is obtained by a relationship between an electric field intensity and a leak current caused by said electric field intensity.

2. The method of evaluating a silicon wafer as claimed in claim 1, wherein the step of treating comprises the steps of:

dipping said mirror polished silicon wafer in said dilute hydrofluoric acid; and cleaning said mirror-polished silicon wafer.

3. The method of evaluating a silicon wafer as claimed in claim 2, wherein the step of cleaning comprises a step of Standard Cleaning 1 (SC-1) cleaning.

4. The method of evaluating a silicon wafer as claimed in claim 1, wherein said reference value is 6 MV/cm in the step of judging.

5. The method of evaluating a silicon wafer as claimed in claim 2, wherein the step of dipping comprises dipping said mirror-polished silicon wafer in a diluted hydrogen fluoride solution which has a concentration more than 1.5 weight %.

6. The method of evaluating a silicon wafer as claimed in claim 1, wherein the step of judging further comprises the steps of:

treating a standard wafer without mirror-polishing in said dilute hydrofluoric acid, and measuring a standard leakage current caused by applying said testing voltage between each of said plurality of electrodes and said standard wafer while increasing said testing voltage step by step, and calculating a standard I-V characteristic; and judging said quality of said mirror-polishing process of said mirror-polished silicon wafers based on a shift between said mirror-polished test I-V characteristic and said standard I-V characteristic.

7. The method of evaluating a silicon wafer as claimed in claim 1, wherein said plurality of electrodes comprise polycrystalline electrodes.

* * * * *